(12) United States Patent
Bain

(10) Patent No.: US 7,454,323 B1
(45) Date of Patent: *Nov. 18, 2008

(54) METHOD FOR CREATION OF SECURE SIMULATION MODELS

(75) Inventor: Peter Bain, Ottawa (CA)

(73) Assignee: Altera Corporation, San Jose, CA (US)

( * ) Notice: Subject to any disclaimer, the term of this patent is extended or adjusted under 35 U.S.C. 154(b) by 580 days.

This patent is subject to a terminal disclaimer.

(21) Appl. No.: 10/646,193

(22) Filed: Aug. 22, 2003

(51) Int. Cl.
*G06F 17/50* (2006.01)

(52) U.S. Cl. .............................. 703/13; 703/14; 703/15; 713/167; 713/187; 713/189; 713/190; 713/193; 713/194; 716/1; 716/5; 705/57

(58) Field of Classification Search .................. 703/14, 703/22, 15, 13; 380/201, 210; 713/150, 713/167, 187, 189, 190, 193, 194; 725/31; 716/1, 4, 5; 705/57
See application file for complete search history.

(56) References Cited

U.S. PATENT DOCUMENTS

| | | | | |
|---|---|---|---|---|
| 5,892,899 | A * | 4/1999 | Aucsmith et al. | 726/27 |
| 5,960,171 | A * | 9/1999 | Rotman et al. | 714/49 |
| 6,006,328 | A * | 12/1999 | Drake | 726/23 |
| 6,172,633 | B1 * | 1/2001 | Rodgers et al. | 341/152 |
| 6,401,230 | B1 * | 6/2002 | Ahanessians et al. | 716/1 |
| 6,668,325 | B1 * | 12/2003 | Collberg et al. | 713/194 |
| 6,871,192 | B2 * | 3/2005 | Fontana et al. | 705/51 |
| 6,915,425 | B2 * | 7/2005 | Xu et al. | 713/165 |
| 6,970,814 | B1 * | 11/2005 | Ashley et al. | 703/14 |
| 7,007,025 | B1 * | 2/2006 | Nason et al. | 707/9 |
| 7,039,576 | B2 * | 5/2006 | Akita | 703/19 |
| 7,065,652 | B1 * | 6/2006 | Xu et al. | 713/190 |
| 7,072,819 | B2 * | 7/2006 | Li | 703/14 |
| 7,080,257 | B1 * | 7/2006 | Jakubowski et al. | 713/187 |
| 7,089,173 | B1 * | 8/2006 | Molson et al. | 703/22 |
| 7,165,229 | B1 * | 1/2007 | Gathoo et al. | 716/1 |
| 7,346,780 | B2 * | 3/2008 | Sinha et al. | 713/187 |
| 7,350,085 | B2 * | 3/2008 | Johnson et al. | 713/193 |
| 7,363,620 | B2 * | 4/2008 | de Jong | 717/141 |

(Continued)

OTHER PUBLICATIONS

M. J. Wirthlin, and B. McMurtrey, "IP Delivery for FPGAs Using Applets and JHDL" 2002 ACM.*

(Continued)

*Primary Examiner*—Kamini Shah
*Assistant Examiner*—Kibrom K Gebresilassie
(74) *Attorney, Agent, or Firm*—Weaver Austin Villeneuve Sampson LLP

(57) ABSTRACT

Method and apparatus for security systems are provided to protect electronic designs from unauthorized usage. An obfuscation system is provided for creating secure simulation models of IP cores that allow efficient evaluation of an electronic design incorporating an IP core but do not allow practical implementation of the IP core. The obfuscation system identifies regions for obfuscation within an IP core. Logic obfuscation is inserted into these regions. Examples of obfuscation include additional circuitry that produces time dilatation, space dilatation, or a combination of the two in the circuitry of an IP core. Typically, the inserted obfuscation does not change the ultimate behavior of the internal signals, but is complicated enough to make an electronic design so slow and/or so large that it cannot be implemented practically. Further, the inserted obfuscation should be of a type is not normally removed by that normal logic optimizations such as synthesis.

49 Claims, 6 Drawing Sheets

U.S. PATENT DOCUMENTS

| | | | | |
|---|---|---|---|---|
| 7,383,443 | B2* | 6/2008 | Zeman et al. | 713/190 |
| 2002/0138244 | A1* | 9/2002 | Meyer | 703/14 |
| 2002/0188432 | A1* | 12/2002 | Houlihane et al. | 703/20 |
| 2002/0188910 | A1* | 12/2002 | Zizzo | 716/1 |
| 2003/0004699 | A1* | 1/2003 | Choi et al. | 703/14 |
| 2003/0093685 | A1* | 5/2003 | Tobin | 713/200 |
| 2003/0145177 | A1* | 7/2003 | Kato et al. | 711/154 |
| 2004/0030912 | A1* | 2/2004 | Merkle et al. | 713/200 |
| 2005/0071659 | A1* | 3/2005 | Ferguson et al. | 713/193 |
| 2005/0071792 | A1* | 3/2005 | Ferguson et al. | 716/4 |
| 2006/0117122 | A1* | 6/2006 | Hannah | 710/100 |

OTHER PUBLICATIONS

F. Koushanfar, G. Qu, "Hardware Metering" 2001 ACM.*

S. Roy, T. Batra, "intellectual Property: methodology for protection and reuse of HDL IP" Created on Jul. 2004.*

F. Koushanfar, and G. Qu, "hardware Metering" 2001 ACM.*

Release of Quartus II 3.0 EDA software by Altera Corporation—Jun. 23, 2003 [Some features described in two internal documents: Gopalsamy, "Simgen—Sgate Level Simulation Netlist Generator," version 1.1, 8 Pages; and Molson, "Simgen Requirements," version 1.0, 11 Pages].

LeBlanc, "Electronic Design Protection Circuit," U.S. Appl. No. 10/819,783, filed Apr. 6, 2004, 57 Pages.

* cited by examiner

METHOD FOR CREATION OF SECURE SIMULATION MODELS

BACKGROUND

Generally, this invention pertains to the protection of intellectual property (IP) that is available to a user for evaluation purposes. More specifically, the invention pertains to secure simulation models of IP cores that allow the user to evaluate the IP cores in electronic design automation (EDA) systems, but prevent the user from implementing the IP cores in a useful hardware device.

EDA systems have become integral to the development of electronic designs for implementation in devices such as programmable logic devices (PLDs) and field programmable gate arrays (FPGAs). An EDA system provides various tools that receive a user's high-level representation of an electronic design and convert it to a form suitable for programming the programmable device. EDA systems may include tools for design entry, compilation, synthesis, mapping, verification, generating a programming file, etc. In addition, EDA systems typically include a simulation tool for confirming that the electronic design is likely to operate as intended.

During the process of creating an electronic design, a user may employ one or more reusable IP cores. These are predefined and preverified functional blocks for performing well-defined tasks that may be incorporated into a user's electronic design. In some cases, they may define an entire electronic design itself. Frequently, they are configurable by a user who can specify one or more parameters appropriate for the desired application. They are designed to work well with existing EDA tools so that users can easily input them into their electronic designs.

IP cores may be viewed broadly to include "megacores," "megafunctions" and other predefined logic blocks for implementation in programmable devices. Megacores define large complex functional blocks such as microprocessors and sophisticated communications blocks such as a block for terminating a trunk protocol on a fiber optic link. Megafunctions define smaller functional blocks such as a DSP filter, multiplier, or FIFO memory. Collections or libraries of simple parameterized megafunctions are available. One example is the library of parameterized modules ("LPM") developed tinder the guidance of the EDIF association.

A user must have authorization (e.g., a license) to implement an IP core in the target hardware devices. The authorization typically comes with a cost that is dependant on the value of the IP core being implemented as well as the type of relationship that exists between the user and the IP core vendor.

In the modern EDA environment, IP core vendors usually allow users to evaluate the IP cores before deciding whether to implement them into a final design. Thus, the vendors must provide their cores in a form that allows both evaluation and compilation to a final hardware programming file. Evaluation requires simulation on one of the many available EDA simulation tools. Therefore an IP core vendor typically provides a customer with two forms of a core: (1) a programming version in the form of source code and/or synthesized netlist for compiling the IP core to a programming file using a particular EDA tool (e.g., Quartus available from Altera Corporation of San Jose, Calif.); and (2) a simulation version that can be executed on a specific third party simulator to evaluate the IP core.

Vendors must be concerned with the possibility of unauthorized use of their IP cores. In one example, the programming version of the IP core is converted to a programming file and used to program hardware devices without a license from the IP core vendor. In another example, a user ports an electronic design containing the IP core to a competitor's hardware platform.

In order to address the issue of unauthorized usage, both the programming version and the simulation version must be protected. One approach to protecting the programming version involves encrypting the IP core's source code and/or synthesized netlist. Another approach is to check for a licensing file before generating a programming file for the target hardware device. These approaches do a good job of protecting the programming version of an IP core from unauthorized use. However, they are not practical for protecting the simulation version of the core. While the programming version can be designed for use with a single EDA platform (e.g., Altera's Quartus), the simulation version typically must work with many different simulation tools. For example, Quartus and other EDA platforms work with multiple different simulation tools, each of which may be provided by a different vendor. Examples of simulation tools include ModelSim by Mentor Graphics Corp. (Wilsonville, Oreg.); Verilog-XL and NC-Verilog simulators by Cadence Design Systems, Inc. (San Jose, Calif.); and VCS simulator by Synopsys, Inc. (Mountain View, Calif.).

Because the simulation version of an IP core must work with a heterogeneous group of simulation tools, security features must work with each of many different tools. One could provide a simple source code version of the IP core for simulation (e.g., Verilog), which could be compiled to the appropriate machine code for any of a number of different simulators. But this approach would provide little if any security. A user could modify the source slightly to allow compilation to a programming file that would circumvent the licensing requirements of the IP vendor.

To provide much greater security, a vendor could provide precompiled versions of the simulation model for each of the available simulation tools on the market. Unfortunately, this would not be practical. The vendor would need to maintain updated versions of the IP for each of a wide range of third party simulation tools. And because many of these tools can run on various computer platforms, a separate compiled version of the IP would be required for each combination of simulator and hardware platform. The problem is exacerbated by the myriad of configuration possibilities for each IP core. For example, a particular core might have 20 or more configurations (depending on user settings). Therefore, the IP vendor might have to provide a separate compiled version of the core for each of these 20 or more configurations (on each of the simulator-hardware combination). Obviously, it would be economically impossible for a vendor to maintain a full range of simulation models.

Another approach to providing the simulation models gives the actual source code of the simulation model to trusted users only (e.g., employees of large companies known to maintain close control over the IP). Unfortunately, this limits the market available to IP vendors. In yet another approach, the IP core vendor provides an equivalent behavioral model of the simulation model. A behavioral model cannot be compiled to produce a working program file for implementing the design on hardware devices. Unfortunately, this approach has its drawbacks in that it usually will not produce a model that is cycle and bit accurate.

There are some EDA system tools such as "VIP" (Visual IP available from Summit Design (Burlington, Mass.)) that attempt to address the problem of making secure simulation versions of IP cores. VIP can generate a secure simulator-independent simulation model, but requires use of various special purpose VIP proprietary tools (e.g., translation programs and adaptors), which must be purchased by the user. Obviously, an IP vendor would prefer not to force potential customers to purchase third-party tools that protect the vendor. Further, VIP generated simulation models are generally large, slow, and require PLI/FLI setup that is difficult to use and is time consuming.

What is needed therefore is an improved approach to providing IP cores that allow simulation in many different third-party simulation tools and at the same time affords security for the IP core vendor.

SUMMARY

The present invention addresses this need by providing systems and methods for "obfuscating" IP cores to produce secure simulation models that are used to evaluate IP cores. Obfuscation generally involves adding logic that bloats the electronic design to make it impractically large and/or slow, but does not affect the primary function of the design. Hence, the resulting simulation models cannot be compiled to produce practical devices but can be executed to provide accurate simulation results. Because the invention acts on high-level representations of IP cores, a resulting simulation model can run on many different combinations of simulator and computational platform.

One aspect of the invention pertains to methods for producing a simulation model of an electronic design. The simulation model produces a hardware simulation result but cannot be directly compiled to produce a practical hardware implementation of the electronic design. The methods may be characterized by the following sequence of operations: (a) receiving a non-obfuscated version of the electronic design suitable for direct compilation to a practical hardware implementation of the electronic design; and (b) adding obfuscation circuitry to produce an obfuscated version of the electronic design from which the simulation model can be created. It should be noted that the obfuscation circuitry does not substantially impact the accuracy of the simulation result, but prevents practical implementation of the electronic design on a hardware device.

In one embodiment, adding obfuscation circuitry includes identifying a region for introduction of obfuscation circuitry in the non-obfuscated version of the electronic design; choosing a type of obfuscation circuitry for insertion; and inserting the chosen type of obfuscation circuitry into the identified region, thereby creating an obfuscated region. Further, identifying a region for introduction of obfuscation circuitry includes identifying in the non-obfuscated version of the electronic design logic of a type that is not removed by a typical synthesizer. The type of logic that is not removed by a synthesizer, for example, includes one or more flip-flops.

In another embodiment, adding obfuscation circuitry includes adding at a first location circuitry for scrambling an input signal by spreading out the input signal in time. Then adding at a second location circuitry for de-scrambling an output signal resulting from the circuitry for scrambling. In yet another embodiment, adding obfuscation circuitry includes adding at a first location circuitry for entangling multiple input signals to thereby spread out the input signals. Next adding at a second location circuitry for detangling an output signal resulting from the circuitry for entangling.

Generally, the obfuscation circuitry will increase the size of the electronic design without changing its function and/or slow the speed of the electronic design without changing its function. In one example, the obfuscation circuitry includes at a first location, a scrambler having circuitry for scrambling an input signal by spreading out the input signal in time; and at a second location, a descrambler having circuitry for descrambling an output signal resulting from the circuitry for scrambling. Alternatively, the obfuscation circuitry includes at a first location, an entangler having circuitry for entangling multiple input signals to thereby spread out the input signals; and at a second location, a detangler having circuitry for detangling an output signal resulting from the circuitry for entangling. In a specific example, the obfuscation circuitry comprises an XOR tree.

Another aspect of the invention pertains to apparatus for producing a simulation model of an electronic design as described. As indicated, the simulation model produces a reasonably accurate hardware simulation result but cannot be directly compiled to produce a practical hardware implementation of the electronic design. Such apparatus may be characterized by the following elements: (a) one or more processors; (b) memory; and (c) an obfuscation module for adding obfuscation circuitry to a non-obfuscated version of the electronic design to produce an obfuscated version of the electronic design from which the simulation model can be created. As indicated, the obfuscation circuitry does not substantially impact the accuracy of the simulation result, but prevents practical implementation of the electronic design on a hardware device.

In one embodiment, the obfuscation module includes a scanning module for identifying a region for introduction of obfuscation circuitry in the non-obfuscated version of the electronic design; a selection module for choosing a type of obfuscation circuitry for insertion; and an insertion module for inserting the chosen type of obfuscation circuitry into the identified region, thereby creating an obfuscated region. The scanning module for identifying a region for introduction of obfuscation circuitry includes identifying in the non-obfuscated version of the electronic design logic of a type that is not removed by a synthesizer. The type of logic that is not removed by a synthesizer, for example, includes one or more flip-flops.

In another embodiment, the obfuscation module includes an optimizer for optimizing the obfuscated version of the electronic design to merge the obfuscation circuitry with functional circuitry.

Yet another aspect of the invention pertains to computer program products including machine-readable media on which are provided program instructions and/or arrangements of data for implementing the methods and apparatus described above. Frequently, the program instructions are provided as code for performing certain operations. Data, if employed to implement features of this invention, may be provided as data structures, data objects, or other appropriate arrangements of stored information. Any of the methods or other features of this invention may be represented, in whole or in part, as such program instructions and/or data provided on machine-readable media.

In a related aspect, the invention provides an IP core product that includes (a) a programming version of the IP core for insertion in an electronic design developed using a specified EDA platform; and (b) a simulation model of the IP core for simulating operation of the IP core in the electronic design. The simulation model comprises obfuscation circuitry, absent in the programming version, which allows a hardware simulation result of the IP core but prevents direct compilation to produce a practical hardware implementation of the IP core.

These and other features and advantages of the invention will be presented in more detail below with reference to the associated drawings.

DETAILED DESCRIPTION

Introduction

Figure 1:
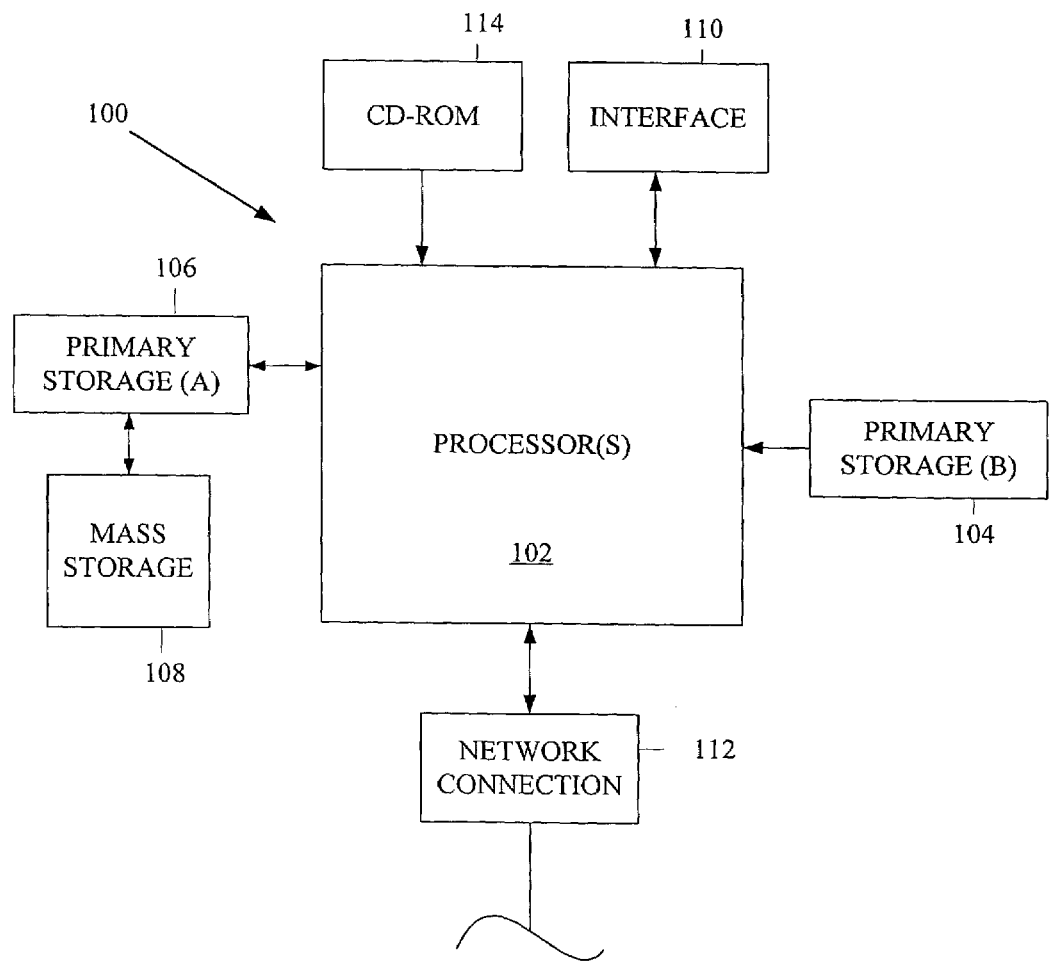
FIG. 1 illustrates a typical computer system that, when appropriately configured or designed, can serve as an obfuscating apparatus of this invention.

The present invention will now be described in detail with reference to a preferred embodiment thereof as illustrated in the accompanying drawings. In the following description, specific details are set forth in order to provide a thorough understanding of the present invention. It will be apparent, however, to one skilled in the art, that the present invention may be practiced without using some of the implementation details set forth herein. It should also be understood that well known operations have not been described in detail in order to not unnecessarily obscure the present invention.

The invention relates to electronic design automation (EDA) systems that employ obfuscation circuitry to create secure simulation models that can be used in the evaluation of IP cores. Systems and methods of this invention are designed to insert obfuscation circuitry in high-level/intermediate-level representations of electronic designs (frequently IP cores) to generate simulation models that can run on a wide range of simulators and computers. The simulation models can accurately simulate the IP core or other electronic design to allow evaluation, but cannot be converted to a practical hardware implementation. Preferably, the simulation models are cycle and bit accurate. The obfuscating circuitry makes the hardware implementation impractically slow and/or large.

In many embodiments, the simulation model is provided in a standard, non-proprietary format that can be compiled to execute on any of a number of computer/processor types (Pentium, SPARC, etc.) running any of a number of different simulators. Hence, the IP provider need only provide a single version (or a limited number of versions) of the model. This is possible because the simulation model of the IP core is written in a high-level language such as a hardware description language (Verilog, VHDL, AHDL, etc.). Generally, the language may be any that is accepted by most commercially important simulators on the market. Thus, the IP vendor need not provide separate evaluation versions of its IP core for multiple combinations of computer/simulator/configuration state.

The challenge of this invention is to provide such generic high-level representation of the IP without allowing unauthorized users to convert to a practical hardware implementation that could be deployed in a commercially viable product. As indicated, this is accomplished by inserting what is referred to herein as "obfuscation" circuitry in the high-level simulation version of the IP core.

In many cases, it will be desirable to provide the IP core as two components: (a) a high-level simulation model with obfuscation circuitry as described, and (b) a protected programming version of the IP that can used on only one or a limited number of EDA design and programming tools. This second version (sometimes referred to as the "programming version" herein) is intended for implementation in the final hardware designs created by legitimate licensed users. Because it is directed to a particular EDA platform (or a small group of them), it can include safeguards that are unavailable for the simulation model. These safeguards include encryption in a format recognized only by the intended EDA tool (e.g., Altera's Quartus), and mechanisms to block generation of a hardware programming file unless a license file is detected. Thus, part (b) of the IP core is typically an encrypted netlist ready for compilation to users having a current license. During the design phase, the user employs the simulation version to evaluate the suitability of the IP core for his or her design.

As indicated, the obfuscation circuitry should render hardware implementation impractical. In addition, it should not impact the simulation result. In other words, the obfuscating circuitry should be transparent from the global perspective of the simulator. The simulation result should be substantially the same with or without the obfuscating circuitry. As explained below, this can be accomplished using a number of different techniques. In addition, the obfuscating circuitry generally should be difficult to identify and difficult to remove from the simulation model. In particular, it should resist removal by conventional tools such as synthesizers and logic optimization routines. This can be accomplished by employing obfuscating circuitry that affects sequential logic elements of the design. Flip-flops, for example, can be used for this purpose. Or sometimes it is sufficient to locate obfuscating circuitry proximate to flip-flops or other sequential logic already present in the basic IP core.

In some cases, the obfuscation circuitry may provide a distinctive "signature" (like a watermark) that would appear in hardware generated using a particular IP vendor's product. This facilitates detection of illicit copies of the IP core in products.

Obfuscation circuitry may modify or replace circuitry that already exists in the non-obfuscated IP core. Alternatively, or in addition, the obfuscation circuitry may comprise additional circuitry that slows or enlarges the overall design. Many types of obfuscation circuitry are available. Examples presented below include non-transforming mask logic, scrambling circuitry that distributes a signal over time, and entangling circuitry that distributes a signal over space.

Generally, the obfuscation circuitry is automatically inserted in non-obfuscated versions of an electronic design (e.g., IP core) by the systems and methods of this invention, which are implemented as software programs (or combinations of hardware and software). Generally, an obfuscation system of this invention must first identify regions within the electronic design for inserting different types of obfuscation. In some embodiments described herein, the regions identified may include logic typically not removed or not easily removed by a synthesizer. Depending on the obfuscation effects desired, different types of obfuscation (entangling logic, scrambling logic, etc.) can be selected for insertion into the electronic design. The selection may be random or predefined. Further, the selection as well as a variety of other procedures described herein may be repeated or executed to further obfuscate the obfuscated electronic design.

As indicated, this invention is particularly valuable for protecting IP cores, as these are widely marketed and must be evaluated on a wide variety of simulation tools. More generally, the invention can be employed to protect any type of electronic design—of which IP cores are but one example.

The term "electronic design" generally refers to the logical structure of an electronic device such as an integrated circuit or a portion of the device. It may be implemented in hardware (usually referred to herein generically as a "target hardware device"). During the design and development effort, an electronic design may exist in various states or stages. These may include a high level Boolean representation (encoded in a hardware design language for example), a schematic or circuit representation, or any other form representing the logical arrangement of a device. In addition to the circuit structure and behavioral descriptions, the electronic design may specify other details such as floor-plan constraints, waveform constraints, timing constraints, fitting constraints, etc. At the gate level, it may exist as a netlist (whether synthesized or not) prior to placement on a target hardware device. Alternatively, it may include completed place and route assignments.

As indicated, an "IP core" is a predefined electronic design available to a user as a functional block for use alone or in conjunction with other components of a larger electronic design. During the design phase, a user inserts a selected IP core into his or her design, makes the necessary connections to other features of a larger electronic design, parameterizes the IP core, and compiles the entire design per the normal procedure. The resulting compiled electronic design includes the off-the-shelf IP core, parameterized as specified by the user, and possibly integrated with other components of the design in a compiled form. This design can be then used to program a programmable device (e.g., an FPGA or PLD) or layout an application specific integrated circuit (ASIC), for example. In the context of this invention, the term "IP core" embodies various predefined off-the-shelf functional blocks used in the EDA industry. Examples include cores, megafunctions, macrofunctions, and the like. The invention is particularly useful in the context of large complex IP cores such as processor cores.

The implemented design associated with an IP core will be specified by various parameters. The user may set certain of these parameters for his or her design. For example, the user may set a buffer functional block to a buffer depth of 16 words and a buffer width of 32 bits. Typical examples of other parameters include bus widths, buffer sizes, memory array dimensions, etc. Various tools are available for the user to insert parameter values specific for his or her design. One example is the MegaWizard tool available from Altera Corporation and described in U.S. Pat. No. 6,401,230.

For context, the electronic design automation process may be divided, roughly, into four stages: (1) Design Entry; (2) Design Compilation; (3) Design Verification; and (4) Device Programming. The design entry stage normally involves a user (e.g., designer) entering a high level behavioral or functional representation of an electronic design. Design entry by the user may be done using different methods, two of which are graphical design entry (e.g., schematic design editor) and text design entry (e.g., hardware description language). In many EDA systems, the output of the design entry stage is a netlist that is derived from the design as entered by the user. Frequently, the netlist is produced from a Hardware Design Language (HDL) representation of the design. Often that representation is provided in Register Transfer Level (RTL), which specifies some level of hardware features.

In the context of this invention, a user may enter a design comprising an IP core. The core is entered as a block defining a pre-constructed netlist, for example. This would be the second component of the IP core described above (i.e., the programming version, as opposed to the simulation model). As indicated, the IP core will typically include a license file to identify authorized users.

After the electronic design (comprising one or more IP cores) has been fully entered, it may be compiled to produce a configuration file describing the programming of a hardware device (stage 2). In one embodiment, this requires confirmation that the user's system has a valid license file or other authorization for use of any IP cores incorporated in the design.

During the design verification stage (stage 3), the design is tested by performing functional and/or timing simulations. This makes use of the simulation model component of the IP core. It should be noted that the design verification stage may be done at anytime throughout the electronic design process and may go through several iterations before a final electronic design is achieved. Finally, the device programming stage (stage 4) entails programming the hardware device with a final configuration file.

Apparatus and Environment

Generally, embodiments of the present invention employ various processes or methods involving data stored in or transferred through one or more computing devices. Embodiments of the present invention also relate to an apparatus for performing these operations. For example, one embodiment is an apparatus that inserts obfuscation logic in non-obfuscated designs in accordance with this invention. Another embodiment is an apparatus that stores or transmits IP cores of this invention, including, for example, both the programming version of the core and the simulation model for the core.

Structurally, the apparatus may be specially constructed or it may be a general-purpose computer selectively activated or reconfigured by a computer program and/or data structure stored in the computer. The processes presented herein are not intrinsically related to any particular computer or other apparatus. Various general-purpose machines may be used with programs written in accordance with the teachings herein, or it may be more convenient to construct a more specialized apparatus to perform the required method operations. A particular structure generally representing a variety of these machines will be described below.

Some embodiments of the present invention relate to computer readable media or computer program products that include program instructions and/or data (including data structures) for performing various computer-implemented operations. Examples of computer-readable media include, but are not limited to, magnetic media such as hard disks, floppy disks, and magnetic tape; optical media such as CD-ROM disks; magneto-optical media; semiconductor memory devices, and hardware devices that are specially configured to store and perform program instructions, such as read-only memory devices (ROM) and random access memory (RAM). The data and program instructions of this invention may also be embodied on a carrier wave or other transport medium (including electronic or optically conductive pathways).

Examples of program instructions include low-level code, such as that produced by a compiler, as well as higher-level code that may be executed by the computer using an interpreter. Further, the program instructions may be machine code, source code and/or any other code that directly or indirectly controls operation of a computing machine in accordance with this invention. The code may specify input, output, calculations, conditionals, branches, iterative loops, etc.

FIG. 1 illustrates, in simple block format, a typical computer system that, when appropriately configured or designed, can serve as a computational apparatus of this invention. The computer system 100 includes any number of processors 102 (also referred to as central processing units, or CPUs) that are coupled to storage devices including primary storage 106 (typically a random access memory, or RAM), primary storage 104 (typically a read only memory, or ROM). CPU 102 may be of various types including microcontrollers and microprocessors such as programmable devices (e.g., CPLDs and FPGAs) and non-programmable devices such as gate array ASICs or general-purpose microprocessors. In the depicted embodiment, primary storage 104 acts to transfer data and instructions uni-directionally to the CPU and primary storage 106 is used typically to transfer data and instructions in a bi-directional manner. Both of these primary storage devices may include any suitable computer-readable media such as those described above. A mass storage device 108 is also coupled bi-directionally to primary storage 106 and provides additional data storage capacity and may include any of the computer-readable media described above. Mass storage device 108 may be used to store programs, data and the like and is typically a secondary storage medium such as a hard disk. Frequently, such programs, data and the like are temporarily copied to primary memory 106 for execution on CPU 102. It will be appreciated that the information retained within the mass storage device 108, may, in appropriate cases, be incorporated in standard fashion as part of primary storage 104. A specific mass storage device such as a CD-ROM 114 may also pass data uni-directionally to the CPU or primary storage.

CPU 102 is also coupled to an interface 110 that connects to one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Finally, CPU 102 optionally may be coupled to an external device such as a database or a computer or telecommunications network using an external connection as shown generally at 112. With such a connection, it is contemplated that the CPU might receive information from the network, or might output information to the network in the course of performing the method steps described herein.

In accordance with this invention, a system such as computer system 100 is used as an electronic design automation tool that provides a system level design interface that facilitates design of test hardware having embedded logic analyzers. Preferably, system 100 also provides system level analysis capabilities and, optionally, one or more of a synthesizer, a compiler, and a target device programmer. Information and programs, including configuration information files and other files can be provided via a network connection 112 for downloading by the designer. Alternatively, such information, programs and files can be provided to a designer on a storage device.

Exemplary Environment and Tool Flow for a Simulation Model Generator

Figure 2:
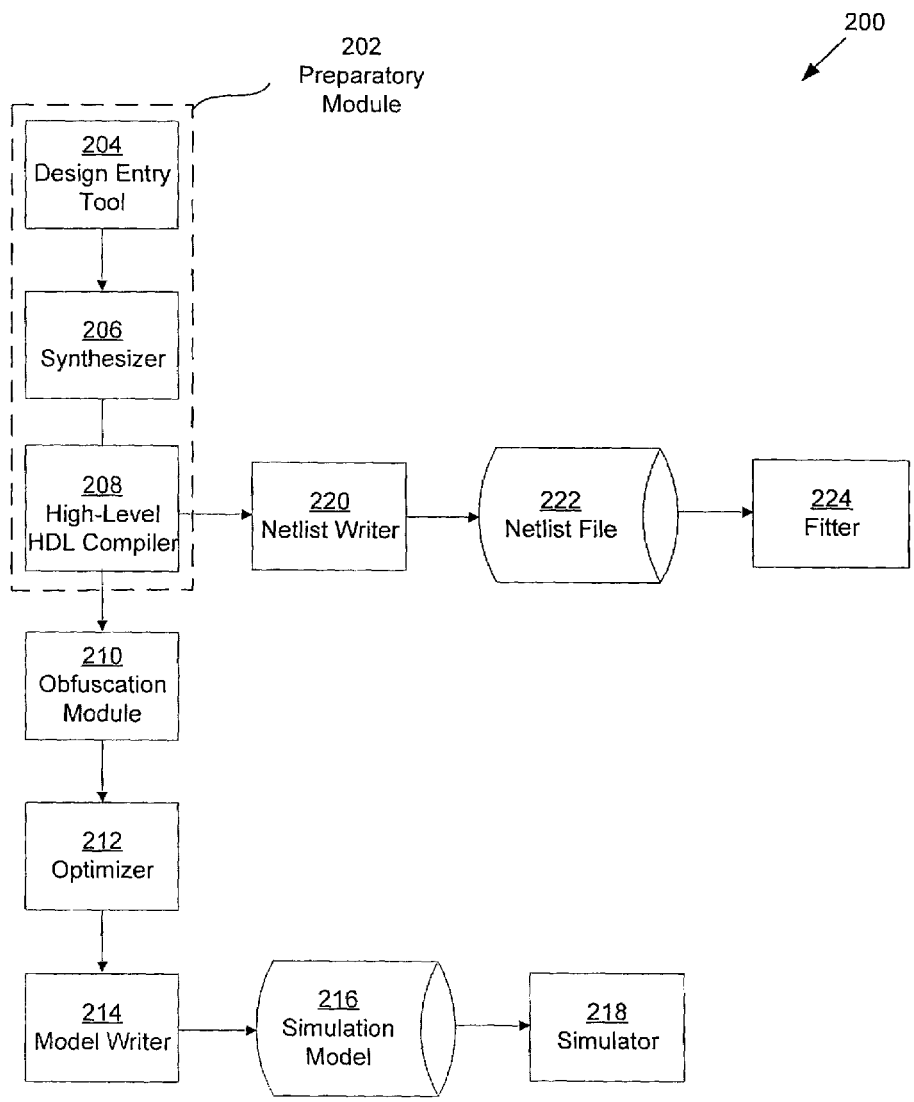
FIG. 2 illustrates a block diagram of an obfuscation system and design flow according to one embodiment of the present invention.

FIG. 2 is a block diagram of a system 200 for modifying/obfuscating an electronic design (preferably an IP core) according to one embodiment of the present invention. A preparatory module 202 is provided for receiving a non-obfuscated version of an electronic design (e.g., IP core) and providing some preliminary processing. The IP core developer provides the electronic design in HDL or a similarly high-level representation (block 204). Generally, the output of module 202 (provided at block 208) is a high-level/intermediate-level, partially compiled version of an electronic design suitable as a starting point for both the simulation model and the programming version. In the specific example of FIG. 2, it is provided as a behavioral, partially HDL representation.

As shown, the module 202 includes a design entry tool 204, a synthesizer 206, and a high-level compiler 208. Design entry tool 204 may be any tool that facilitates high-level entry of the electronic design. For example, depending on the form of entry the user chooses, design entry tool 204 may be either text based (e.g., HDL such as Verilog, VHDL, RTL) or graphic based (e.g., schematic) or a combination of both text and graphic based. Synthesizer 206 synthesizes the high-level representation of the electronic design. In general, synthesizers produce an equivalent representation of the electronic design entered through design entry tool 204. The equivalent representation is often in a resultant source code format. Any suitable synthesizer may be used. In a preferred embodiment, synthesizer 206 is the Quartus Native Synthesis (QNS) tool available from Altera Corporation. Other suitable synthesizers include the LeonardoSpectrum product available from Mentor Graphics of Wilsonville, Oreg. and the Synplify product available from Synplicity of Sunnyvale, Calif. Finally, high-level compiler 208 can be used to provide a relatively high level compilation of the electronic design. The resulting compiled code typically represents the behavior of the electronic design, but not the physical representation. It is preferably in an HDL neutral format. That is, the format is neither VHDL, Verilog, nor any other widely used HDL format. In one embodiment, high-level compiler 208 can be incorporated into part of the Quartus II version 3.0 tool available from Altera Corporation.

Note that in alternative embodiments, one or both of synthesizer 206 and compiler 208 can be dispensed with. So long as a high-level/intermediate-level representation (e.g., an HDL or RTL representation) of the IP core is available for obfuscation, synthesis and partial compilation are not strictly required.

As shown in FIG. 2, the output of preparatory module 202 is made available to both a netlist writer 220 and an obfuscation module 210. These present the paths to the two separate portions of an IP core. The path from netlist writer 220 produces the programming file for hardware implementation of the design and the path from obfuscation module 210 produces the simulation model.

Focusing first on the simulation model path, obfuscation module 210 is used to produce obfuscation circuitry in the non-obfuscated version of the core provided by module 202. Obfuscation module 210 generally performs the functions of scanning the core, selecting features for obfuscation, and inserting appropriate obfuscation. These functions may be implemented as a scanning module, a selection module, and an insertion module, for example. Each of the scanning, selection, and insertion functions may be performed separately, sometimes with user intervention, or in a single automated global operation. The scanning function identifies regions for introduction of obfuscation in the non-obfuscated version of the electronic design. The selection function chooses the types of obfuscation (e.g., entangling circuitry versus scrambling circuitry). And the insertion function inserts the chosen type of obfuscation into the identified region, thereby producing an obfuscated region.

Referring again to FIG. 2, an optimizer 212 can be optionally provided. Optimizer 212 is configured for receiving the obfuscated version of the electronic design (IP core) from obfuscation module 210 and optimizing it to effectively merge or blend portions of the obfuscated region with portions of the non-obfuscated region. An advantage of optimizing is to lessen the ability for identifying and/or removing the obfuscation circuitry from the simulation model of the electronic design, thereby further protecting the electronic design from unauthorized usage. In general, any widely used optimizer may be employed. Examples include the LeonardoSpectrum product available from Mentor Graphics of Wilsonville, Oreg. and the Synplify product available from Synplicity of Sunnyvale, Calif.

After the obfuscated version of the electronic design is generated by module 210 and optionally optimized by module 212, it may be in a form that is suitable for immediate use. In some cases, however, a further refinement may be required. In one such case, the compiler 208 reduced the electronic design to a language neutral format. Thus, before the obfuscated design can run on third party simulators, it must be converted back to a standard format such as Verilog or VHDL. For this purpose, a model writer 214 is provided. In one embodiment, model writer 214 acts as a neutral translation utility, which is a feature that can be incorporated into Quartus II release 3.0. It functions to convert the obfuscated version of the electronic design to a simulation model 216 with a standard format usable by a variety of simulators 218 and computational platforms. Thus, an advantage of model writer 214 is that it renders electronic designs that are represented originally or intermediately in a format not readily available for different simulators compatible with simulators having specific format requirements. Another advantage is that model writer 214 allows a designer (e.g., original IP core designer) to choose between different formats for entering the electronic design whether or not the format chosen is readily available for different simulators 218 to use.

As shown in FIG. 2, the path to a programming version of the IP core begins with netlist writer 220. Any conventional netlist writer that can act on the output of module 202 may be employed. Netlist writer 220 will create a netlist file 222 that can be in any conventional format (e.g., .vqm). Thereafter, a fitter 224 is provided for performing place and route operations on the IP core. Note that fitter 224 performs these operations on a non-obfuscated version of the electronic design and not on an obfuscated version of the electronic design, which would increase the difficulty and the time to place and route due to increased logic capacity (i.e., size) presented by an obfuscated version of the electronic design.

Note that programming version of the IP core can provided in a variety of formats. It is not important in the context of this invention that the programming version be in the form of HDL, a netlist, a compiled (place and route) version, etc. All that it is required is to not include the obfuscation circuitry and otherwise be compatible with an intended EDA environment.

It is frequently desirable that the programming version possesses some measure of security. To this end, it may be encrypted prior to distribution. It may also include some IP identifier that will require confirmation of a license file prior to conversion to a programming file. Further, it may include a signature or watermark to allow detection in hardware designs. These features may be added at any stage in the path to a programming version.

From the above discussion, the meanings of certain relevant terms should be reasonably clear. However, to further illuminate certain concepts pertinent to this invention, the following definitions are provided. These definitions are provided to assist in understanding the concepts presented in the specification. They do not necessarily limit the scope of this invention.

A "netlist" is used to describe the functionality and connectivity of a digital circuit design that can be implemented on a programmable logic device or other target hardware device. The netlist is represented as a hierarchical collection of gates, state machines, high level constructs such as counters or adders, or any other means of defining a collection of outputs based on a collection of inputs. The nodes of the netlist (gates, state machines, etc.) are connected together via nets. Each of these nets is associated with a named digital signal. A netlist may be synthesized to remove redundant logic, simplify the gate layout provided by a user, etc.

When in the form of a netlist (such as a synthesized netlist), an electronic design may be divided into "logic cells" (sometimes called "hardware cells" herein) representing various logic functions within the electronic design. During compilation, these logic cells are mapped onto physical structures known as "logic elements" which reside on the target hardware device. Logic elements may include various types of programmable logic including look up tables (LUTs), product terms, memory blocks, dedicated arithmetic elements such as multipliers and accumulators, etc. The criteria for mapping gates or other design features into logic cells result from the requirement that the resulting logic cell must fit into one logic element. An example of a logic cell is a collection of gates (connected in some way and implemented in a look-up table) combined with a register and configured to implement a multiplexer.

A "compiler" takes a high level representation (e.g., a netlist) as an input, and using a component database puts the information necessary for layout (hardware implementation) and sometimes verification and/or simulation into an object file or files. A simulator takes the object file(s) and simulation models, and generates a set of simulation results, acting on instructions, initial conditions, and input signal values provided to it either in the form of a file or user input. When compilation is complete, a target hardware device is programmed (or otherwise constructed) with the compiled design.

In the context of this invention, a target hardware device is any hardware device on which an EDA designed device is implemented. It may include memory elements, registers, and/or dedicated functions such as processor cores and DSP blocks. The logic elements, memory elements, and registers are typically the fundamental elements of the hardware device's architecture on which different electronic design components can be defined. These elements may be grouped into blocks such that each discrete element is associated with a block (or other arbitrary containment entity). There may be higher-level organization in the device such that logic blocks are grouped into rows or some other arbitrary entity.

Target hardware devices may be custom integrated circuits (e.g., ASICs), custom configurations for programmable integrated circuits, or general purpose, mass-produced integrated circuits. Many embodiments of the invention employ programmable devices such as programmable logic devices (PLDs) programmable by a user to produce a custom design for that user. Programmable logic devices are integrated circuits that may be programmed to perform a desired function and include programmable logic arrays (PLAs), programmable array logic (PAL), field programmable gate arrays (FPGAs), complex programmable logic devices (CPLDs), and a wide variety of other logic and memory devices that may be programmed. Altera's Stratix™ devices are examples of PLD target hardware devices. They contain logic elements, memory, and dedicated parallel multiplier circuitry (denoted DSP Blocks).

Obfuscation Techniques

Figure 3:
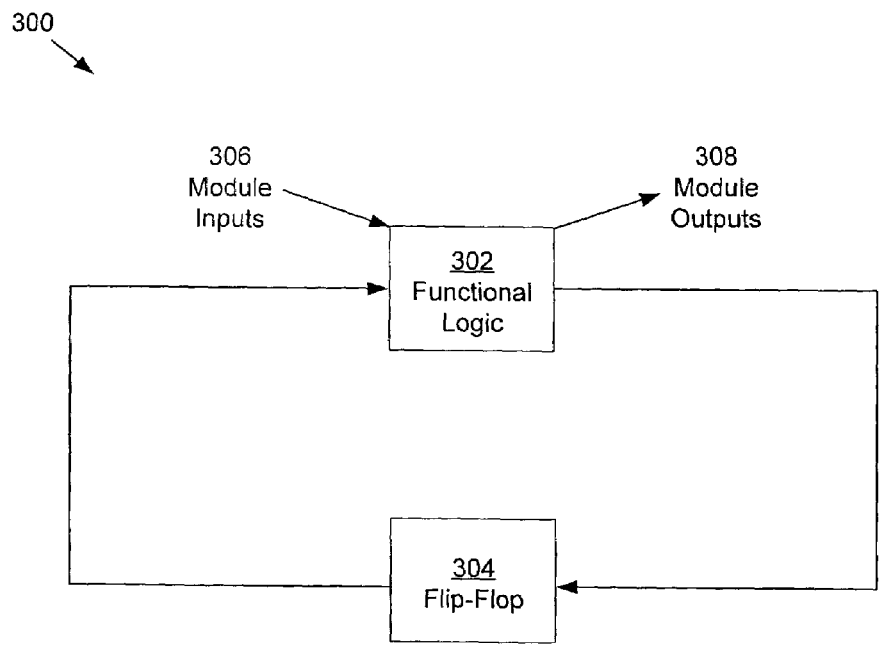
FIG. 3 illustrates a canonical module structure for obfuscating according to one embodiment of the present invention.

As indicated, the obfuscation process takes, as a starting point, a non-obfuscated version of an electronic design. It must identify regions where obfuscation circuitry is to be inserted. In one approach, those regions are proximate to flip-flops or sequential logic elements (as opposed to combinatorial logic elements). FIG. 3 illustrates a canonical module structure 300 of a generic electronic design. From the perspective of obfuscation logic, the electronic design has (a) features appropriate for obfuscation and (b) all other features. As shown, canonical module structure 300 contains functional logic 302 and flip-flops 304. Flip-flops 304 reside on a path connected to functional logic 302. More specifically, an output of functional logic 302 is an input to flip-flops 304 and an output of flip-flops 304 is an input to functional logic 302. This is but one way to represent the general concept that an electronic design has flip-flops in communication with other logic features. The flip-flops are the relevant part for this example. Generally, flip-flops 304 include any number of flip-flops, alone or in combination with closely related logic features. In other embodiments, the relevant portion of the design (for obfuscation) will be a different feature such as an adder. Preferably, the salient logic for obfuscation will be of a type that is substantially not removed by a synthesizer or optimizer.

In the FIG. 3 depiction, functional logic 302 includes any remaining region within the portion that is not selected for inserting obfuscation. Typically, functional logic 302 communicates with external features by receiving module inputs 306 sending module outputs 308.

Figure 4:
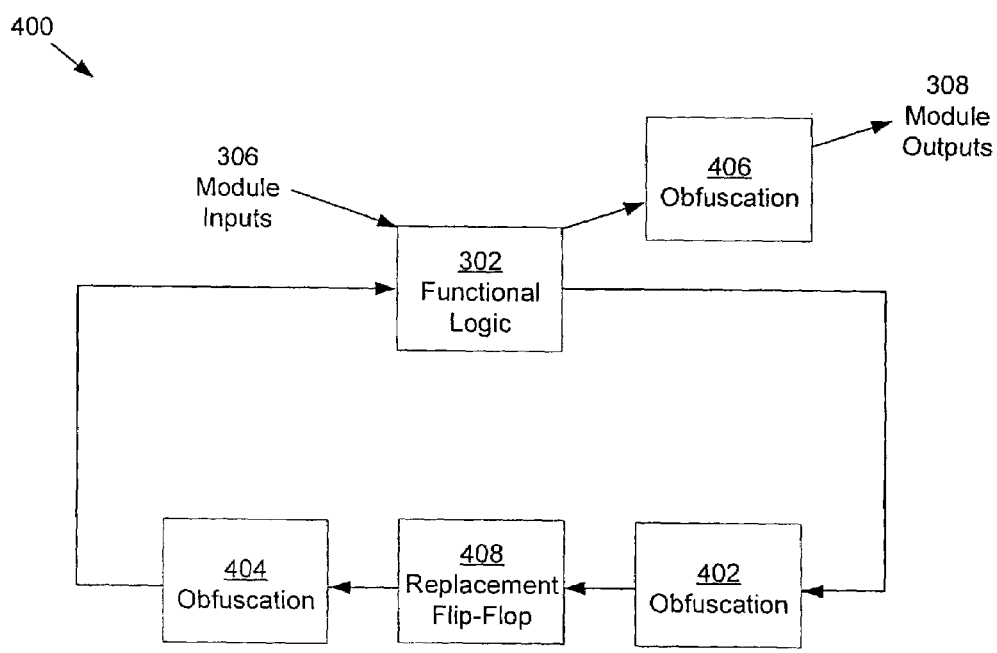
FIG. 4 illustrates an obfuscated module structure according to one embodiment of the present invention.

Next, FIG. 4 illustrates an obfuscated module structure 400 that can result after obfuscation in accordance with an embodiment of this invention. Obfuscated module 400 resembles the canonical module structure 300 of FIG. 3 in so far as it contains interconnected flip-flops and functional logic. However, it includes obfuscation circuitry such as obfuscation blocks 402, 404, and 406. It also includes "replacement flip-flops" 408 (in place of original flip-flops 304). The individual flip-flops of replacement flip-flops 408 may include some or all of the original flip-flops 304. Typically they include additional flip-flops beyond those present in the original, non-obfuscated design. Generally, replacement flip-flops 408 include any number and type of flip-flops together with (in some cases) associated logic.

Generally the obfuscation blocks may be inserted anywhere in the electronic design. In some embodiments, they are inserted at predetermined locations and in other embodiments, they are inserted randomly. An example of a predetermined location is proximate to flip-flops or other logic that is generally not removed by synthesis. In another example, the predetermined location is proximate to portions of the electronic design that contain proprietary or sensitive information (e.g., trade secret). In the example of FIG. 4, obfuscation blocks 402 and 404 are inserted on the input and output of replacement flip-flops 408 (or alternatively original flip-flops 304). Note that obfuscation block 406 is located along a path between functional logic 302 and module output 308. Although not shown, another obfuscation block may be located along a path between module input 306 and functional logic 302.

As the examples below will make clear, an obfuscation block may be used in a stand-alone manner or it may require one or more other obfuscation blocks. In the later case, a first obfuscation block may modify signals in a deterministic fashion and a second obfuscation block may undue the modification so that, from a global perspective, the simulation model produces output signals that would be identical to those produced by the non-obfuscated version. Examples of complementary pairs of obfuscation blocks include entangler-deentangler pairs and scrambler-de-scrambler pairs. In many cases, it will not be permissible to put such complementary pairs of obfuscation blocks immediately adjacent one another in a module. To do so, would produce a design in which a synthesizer could easily remove the obfuscation circuitry. Therefore, it is frequently desirable to separate the complementary block from one another using flip-flops or other synthesis resistant logic. As shown in FIG. 4, obfuscation block 402 and obfuscation block 404 straddle replacement flip-flops 408. Furthermore, obfuscation block 404 would generally function as the complement of obfuscation block 402.

Figure 5:
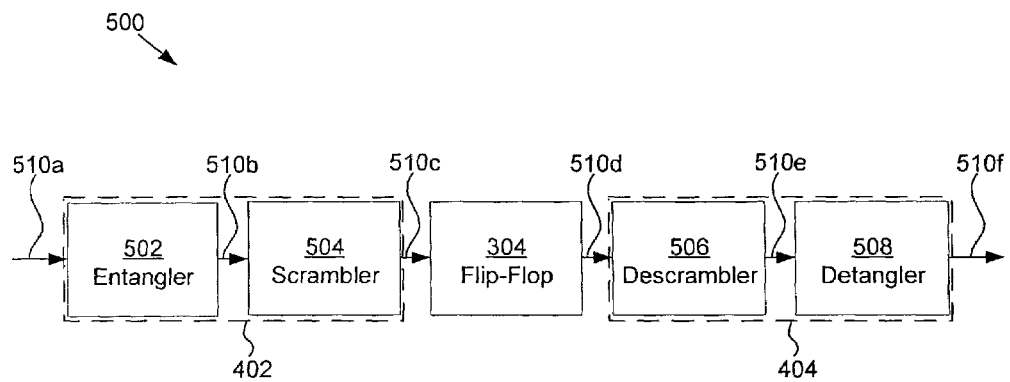
FIG. 5 illustrates an example of an obfuscated IP core according to one embodiment of the present invention.

FIG. 5 presents an arrangement of obfuscation circuitry 500 according to one embodiment of the present invention. This arrangement may appear recurrently in some designs. As illustrated, circuitry 500 can correspond to the generic arrangement of obfuscation blocks 402 and 404 and flip-flops 304 (or 408) in FIG. 4. In this example, obfuscation block 402 includes an entangler 502 and a scrambler 504. In a complementary fashion, obfuscation block 404 includes a descrambler 506 and a detangler 508. The various pieces of obfuscation circuitry may be arranged in any order, so long as each complementary pair (e.g., entangler-detangler; scrambler-descrambler) is arranged in a fan out manner and detangler and descrambler are downstream from the entangler and scrambler. This ensures that the signal values output by the obfuscation circuitry do not vary from those seen in the non-obfuscated version of the design. To illustrate this, the obfuscation circuitry 500 in FIG. 5 includes entangler 502, scrambler 504, flip-flop 304 (or 408), descrambler 506, and detangler 508 arranged in that order along a signal path. As such, the complementary pair of scrambler 504 and descrambler 506 is arranged together with another complementary pair of entangler 502 and detangler 508 in a fan out manner. In other words, the obfuscation circuitry should not be arranged such that the complementary pairs partially overlap one another. For example, an obfuscation circuitry where the entangler 502, scrambler 504, flip-flop 304 (or 408), detangler 508, descrambler 506 are arranged in that order along a signal path have partially overlapping complementary pairs. It is important to note from the above examples that the detangler and descranibler are downstream from the entangler and scrambler.

As shown in FIG. 5, a signal path 510a feeds into entangler 502. A generated output of entangler 502 on a path 510b feeds scrambler 504. From there, the output of scrambler 504 along a path 510c serves as the input to flip-flops 304. Downstream from flip-flops 304 on a path 510d is the input of descrambler 506. The output of descrambler 506 is no longer scrambled, but it remains entangled. So, the output from descramber 506 is fed, via a path 510e, to the input of detangler 508. Finally, a detangled and descrambled output of detangler 508 is provided on a line 510f.

As indicated, there are various types of obfuscation circuitry that can be used with the present invention. Three examples are presented here. These are scrambler circuitry, entangler circuitry, and non-transforming mask circuitry. Specific examples of each type of circuitry will now be described.

Generally, a scrambler transposes portions of an input signal over time to render the signal unintelligible. A descrambler simply reverses the process. There are many versions of scrambler and descrambler circuitry known in the art, particularly the telecommunications art. Many of these can be used with the present invention. A chosen scrambler/descrambler must simply be positioned in the electronic design in a manner allowing the original input signal to be returned (unscrambled) elsewhere in the circuitry. This must be done in a manner that does not materially impact simulation results.

Figure 6:
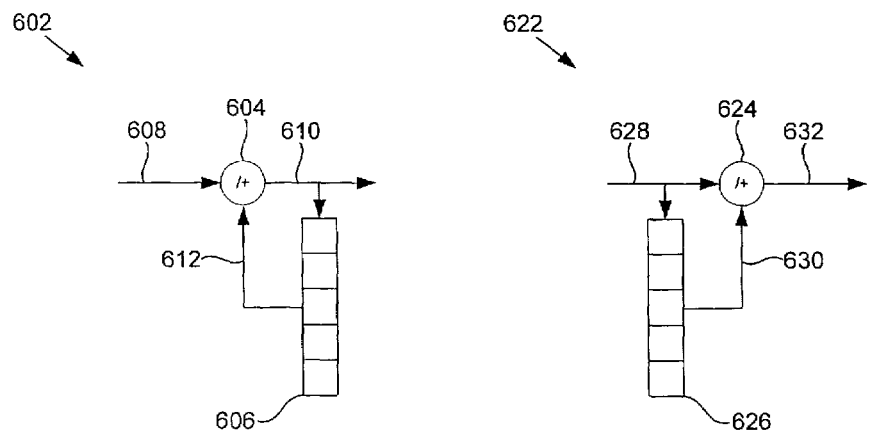
FIG. 6 illustrates logic for scrambler/descrambler obfuscation according to one embodiment of the present invention.

FIG. 6 presents an example of scrambler/descrambler circuitry that may be used for obfuscation in accordance with an embodiment of the present invention. The scrambler circuitry 602 scrambles an input signal over time. The descrambler circuitry 622 undoes the signal scrambling caused by scrambler circuitry 602. Scrambler 602 generates as output a multi-bit pattern that is spread over several clock cycles for every single bit received as input over one clock cycle. Descrambler 622 takes a multi-bit pattern that is spread over several clock cycles as input and produces a single bit as output over one clock cycle.

In the depicted embodiment, the logic for scrambler 602 includes an XOR gate 604 and a shift register 606. Generally, shift register 606 is arranged to store signal values (e.g., on a bit by bit basis) output from XOR gate 604 and reintroduce them as an input to gate 604 at a later time (a defined number of clock cycles later). In one embodiment, shift register 606 is a collection of binary cells for storing a bit-vector and capable of serial transfer between adjacent cells. Therefore, for every clock cycle, a signal value 610 (e.g., bit) is inputted into shift register 606 and all other values in register are shifted to the next adjacent cell. It is important to note that shift register 606 contains the n previous bits of signal value 610. Accordingly, a subset of bits 612 from shift register 606 is inputted along with input signal value 608 into XOR logic operator 604 to generate signal value 610, which is the scrambled input signal value 608.

Descrambler 622 is configured to function as an inverse (e.g., complement) of scrambler 602. Therefore, the input signal on line 608 will also be the output signal on line 632, allowing for propagation through the scrambler/descrambler logic and possibly some modification by intervening logic (e.g., flip-flops). Descrambler 622 operates as follows. At every clock cycle, a signal value 628 (e.g., a bit) is input into shift register 626. Accordingly, a subset of bits 630 from shift register 626 is input along with signal value 628 into XOR gate 624 to generate output signal value 632, which is the descrambled output signal. Thus, two XOR gates, two shift registers, and the associated line paths have been added to bloat an electronic design without impacting signal values.

Generally, because they provide inverse functions, scrambler 602 and descrambler 622 may be arranged in any order anywhere along a path within any portion of the electronic design. For example, scrambler 602 and descrambler 622 may be connected directly to each other or separated by other features (e.g., flip-flops). If scrambler 602 is directly connected to descrambler 622 by connecting output signal value 610 to input signal value 628, output signal value 632 would effectively reproduce input signal value 608 after a few clock cycles. In effect, input signal value 608 is delayed from the time it enters scrambler 602. On the other hand, if scrambler 602 is separated from descrambler 622 by another feature, output signal value 632 would effectively reproduce after a few clock cycles the original output signal value from the common region.

Entangling circuitry distributes an input signal over space. Preferably, it does so in a manner that reduces the overall speed of a critical path as well as other paths in a portion of an IP core. Because it does this by adding extra circuitry to the core, it bloats the design.

Entangling logic combines multiple input signals by various logic operations, such as adding, subtracting, XOR-ing, etc. Consider a region of an IP core that receives N different signals. An entangler in this region entangles the signals to produce N or more output signals, each of which is a Boolean combination of two or more input signals. For example, an entangler may receive two signals, a and b. In one operation, it adds these signals to produce one output, a+b, and in another operation, it subtracts them to produce another output, a−b. Now imagine that input signal b arrives later than input signal a. The entangled signals, a+b and a−b, are not valid until b arrives. So entangling the signals effectively slows signal a to the speed of the slower signal b. This point can be generalized in systems having many more inputs. The speed of any N' output signals will be no faster than the slowest input signal to the entangler. Note that at some location in the IP core, downstream from the entangling logic, complementary detangling logic must be inserted. Obviously, by inserting entangling logic, one increases the size and slows the speed of an electronic design.

In another example, the entangler can be configured to take n signals and compute an n-bit cyclical redundancy check (CRC). The detangler receives the n-bit result and computes an n-bit "inverse CRC."

As stated, entangled signals are Boolean combinations of the original input signals. To maximize the performance penalty, the entangling logic should entangle a large number of signals so that any given output signal is a Boolean combination of all or most input signals. To accomplish this, one may employ a large tree of Boolean logic operators. In one embodiment, a large XOR tree is used.

Figure 7:
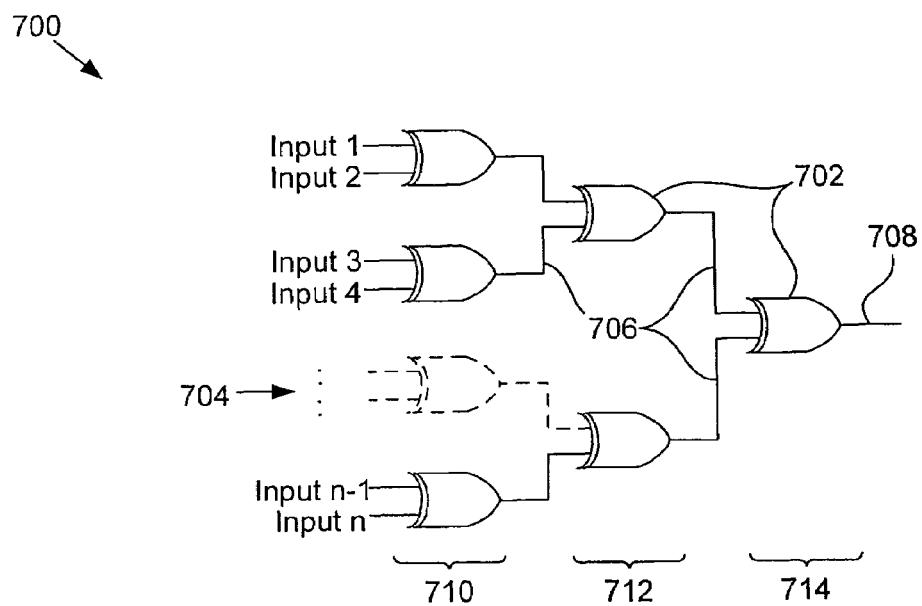
FIG. 7 illustrates logic for a typical n-input XOR tree serving as entangler obfuscation circuitry according to one embodiment of the present invention.

FIG. 7 illustrates an example of an n-input XOR tree 700 for use as an entangler according to one embodiment of the present invention. XOR tree 700 includes a plurality of XOR logic operators 702 connected together via branches 706 to form a tree. Generally, XOR tree 700 can receive multiple inputs 704 (e.g., n inputs) into a first set of XOR logic operators 702 at a first level 710. The outputs from the first set of XOR logic operators 702 are then inputs into a second set of XOR logic operators 702 at a second level 712; thus, forming branches between different levels in XOR tree 700. This structure can be repeated until an inner level 714 is reached where a single XOR logic operator remains and where a single output 708 is generated. In one embodiment, n output signals may be generated by using multiple XOR trees, one for each output signal.

A detangler is complementary circuitry that returns the n original input signals. For example, assume an entangler that takes four original inputs signals (e.g., I1, I2, I3, I4) and generates corresponding entangled signals (e.g., E1, E2, E3, E4). Also assume that a detangler takes the entangled signals (e.g., E1, E2, E3, E4) and generates corresponding output signals (e.g., O1, O2, O3, O4). The entangler entangles the four original input signals as defined by: E1=I1 XOR I3; E2=I1 XOR I2; E3=I2 XOR I4; E4=I2 XOR I3 XOR I4. On the other hand, the detangler detangles the entangled signals as defined by: O1=E1 XOR E3 XOR E4; O2=E1 XOR E2 XOR E3 XOR E4; O3=E3 XOR E4; O4=E1 XOR E2 XOR E4. Accordingly, the detangler generates output signals: O1=I1; O2=I2; O3=I3; O4=I4, which are the four original input signals.

Figure 8:
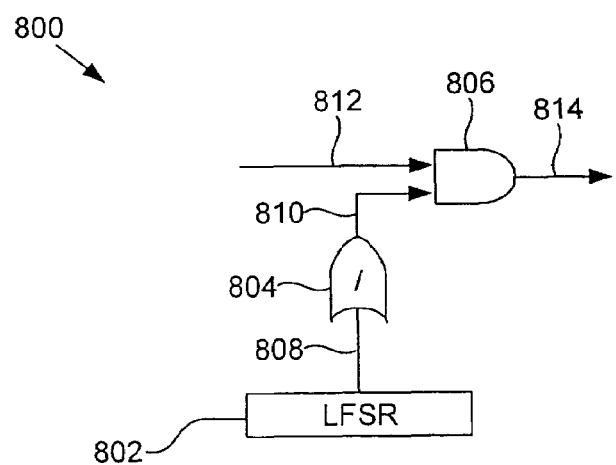
FIG. 8 illustrates logic for masker obfuscation according to one embodiment of the present invention.

Another general class of obfuscation logic is referred to as "a non-transforming mask." From the perspective of a signal, the mask appears to be a simple line, as it does not transform the signal. But it does substantially increase the area of the electronic design. FIG. 8 illustrates a masker 800 according to one embodiment of the present invention. As shown, masker 800 includes a linear feedback shift register (LFSR) 802, OR gate 804, and AND gate 806. In one example, LFSR 802 includes multiple shift registers. Importantly, LFSR 802 always generates at least one non-zero bit value. Therefore, when masker 800 takes all the bits in LFSR 802 as inputs 808 into OR gate 804, a non-zero output 810 (e.g., bit value 1) is generated. The non-zero output 810 is then inputted together with input signal value 812, which is from the original signal path, into logic AND gate 806. Thus, an output signal value 814 from AND logic operator 806 is identical to input signal value 812. Mask 800 has effectively increased the space occupied by the IP core without transforming its function.

Yet another general class of obfuscation involves adding flip-flops to a design or modifying existing flip-flops. This obfuscation was discussed generally with reference to FIGS. 3 and 4. So long as the modifications to and/or additions of flip-flops does not significantly impact the simulation results, wide latitude is permitted in the implementation of this form of obfuscation.

Often the flip-flops relevant to obfuscation are chosen in a block for modification and/or for defining a region where additional obfuscation circuitry is to be inserted (e.g., entanglers and/or scramblers). It is often preferable (particularly for entangler applications) that the flip-flops in the selected block are driven with the same clock (using the same clock edge) and elicit substantially the same reset behavior. In some cases, it is desirable that the flip-flops in the block are functionally unrelated.

In one example of a flip-flop based obfuscation where the flip-flops in the group of flip-flops generally reset to zero, the inserted obfuscation circuitry translates all-zero inputs to all-zero flip-flops to all-zero outputs. Typically, the obfuscation circuitry does not affect the original reset outcome of the flip-flops. This is particularly true when the obfuscation circuitry includes scrambler-descrambler circuitry, entangler-detangler circuitry, or non-transforming mask circuitry.

In some cases, certain flip-flops in the group of flip-flops will not reset to zero. This can be a problem when the flip-flops are straddled by entangler/detangler logic. In such cases, signals to each of the flip-flops contain some components from each of the input signals to the entangler. To obtain a consistent result on reset, all flip-flops should have the same reset behavior. To address this issue, the obfuscation system may input invertors before and after the flip-flop functional logic, where the flip-flop gives a non-zero reset result and the other flip-flops give a zero reset result.

Methodology and Logical Structure for Generating an Obfuscated Version of an Electronic Design The obfuscation circuitry may be inserted by any of a number of different methodologies. Generally, a system for obfuscating a design must identify one or more regions of the design for inserting obfuscation circuitry, identify the circuitry to insert, and insert it. Preferably, though not necessarily, the obfuscation operations are performed automatically, without user intervention, by software and/or hardware that receives a non-obfuscated version of the design. In alternative cases, the IP developer interacts with the obfuscation system at one or more stages to select settings (e.g., quantity of obfuscation to insert, type of obfuscation to insert (entanglers vs. scramblers vs. additional flip-flops, etc.). This invention also includes the case where the IP developer manually inserts some or all of the obfuscation circuitry.

Figure 9:
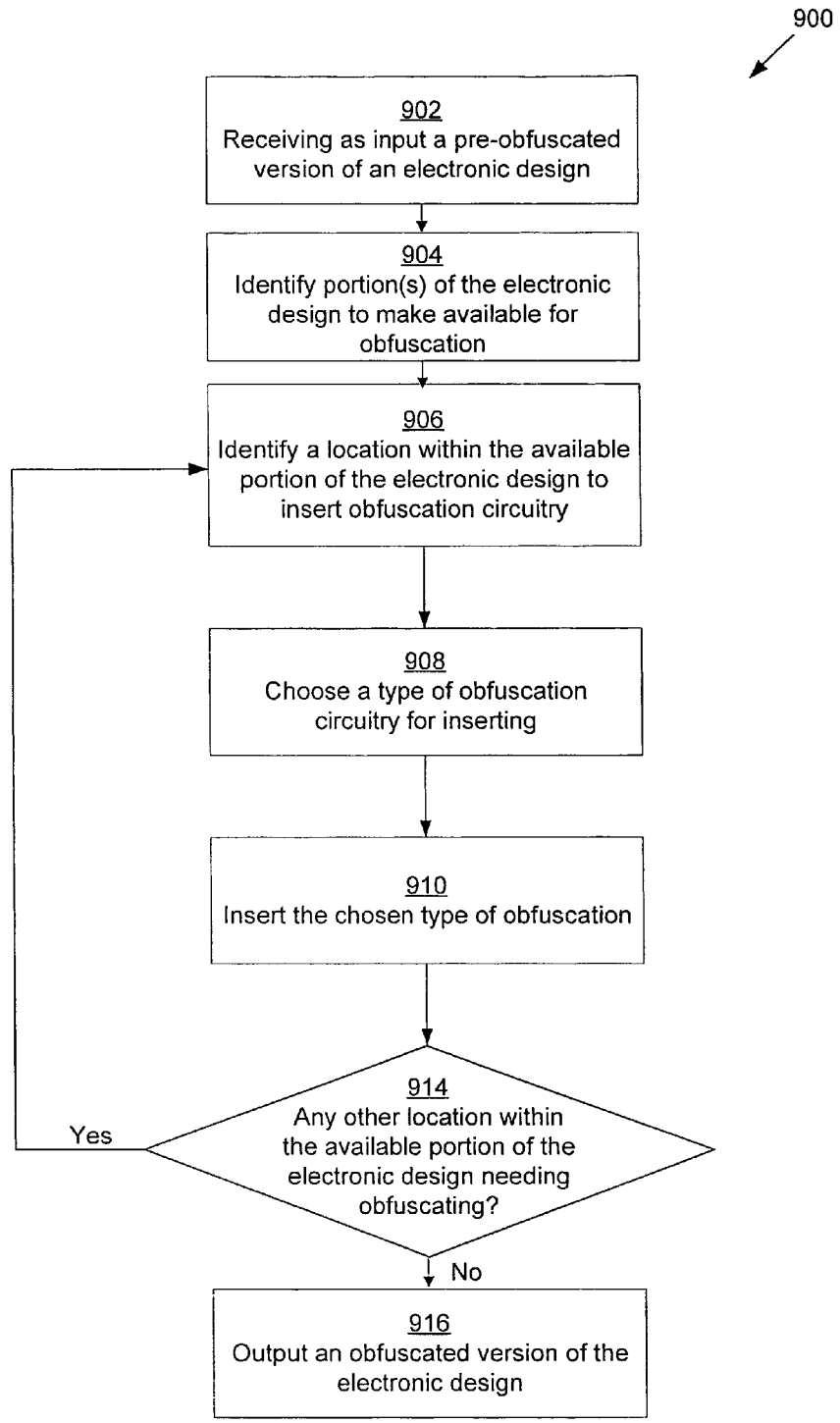
FIG. 9 illustrates a flowchart of an obfuscation module according to one embodiment of the present invention.

An example of one suitable obfuscation methodology is presented in FIG. 9. FIG. 9 shows a high level flowchart 900 of an obfuscation system (e.g., module 210 of FIG. 2). The process begins at 902 where the obfuscation system receives, as input, a non-obfuscated version of an electronic design. As mentioned earlier, the non-obfuscated version of the electronic design may take the form of a high-level description (generally without delineating specific hardware). One example (per FIG. 2) is a partially compiled version of the electronic design. The IP vendor may create the non-obfuscated version by conventional techniques and need not employ any special design techniques. It is only during the obfuscation methodology, described here, that any special operations must be performed.

Upon receiving the non-obfuscated version of the electronic design, an operation 904 identifies portions or regions of the electronic design to make available for obfuscation. This is a preliminary and optional step that serves to identify gross regions of the design where obfuscation can be inserted. In other regions, no obfuscation circuitry will be inserted. Typically, the regions identified in block 904 are selected for a particular predetermined reason, but in some cases they may be randomly selected. In one example, a portion designated for grey box support is made off-limits for obfuscation. Grey box support is a debug feature that allows users to view design details at various stages during design development. Using this feature, a user could view and perhaps remove, obfuscation circuitry. Therefore if a design includes both regions of grey box support and no grey box support, operation 904 could select the regions of no support for insertion of obfuscation circuitry.

Next, at an operation 906, the system identifies a specific location (e.g., group of logic elements; path) within the available portion of the electronic design where a unit of obfuscation circuitry will be inserted. As mentioned above, this may be a location that is unlikely to be modified by a synthesizer or other logic reduction/replacement tool. Locations adjacent to state machines often meet this criterion. Operation 906 can be important to the success of an obfuscation routine. Synthesizers will naturally try to remove complementary blocks of logic, where one inverses the operation of the other; e.g., a scrambler and descrambler. However, by locating the complementary logic blocks on opposite sides of a flip-flip, for example, an obfuscation tool can protect the blocks from removal by a synthesizer.

Another criterion that may be employed to identify obfuscation locations is in relation to a critical path. As a rate-determining path that substantially affects the performance of the electronic design, timing critical paths can be profitable locations for obfuscation. For entangling, in particular, it may be desirable to choose a critical path as one path for obfuscation.

Yet, another criterion that may be employed to identify obfuscation locations is in relation to portions of the electronic design that contain proprietary or sensitive information. For example, identifying an obfuscation location where trade secret is present.

Before inserting the obfuscation circuitry, the obfuscation system may need to choose a specific type of obfuscation appropriate for the selected location. See block 908. This choice may be dependent on global objectives such as performance degradation versus size bloating, as well as the nature of the specific location selected. As indicated, examples of the types of obfuscation that may be selected as appropriate include entanglement, scrambling, masking, and addition of state machines (or modification of existing state machines).

In some cases, only one type of obfuscation logic will be selected and so operation 908 may be dispensed with. In other cases, which can also dispense with operation 908, insertion of the obfuscation circuitry takes place in separate passes through the design, with each pass inserting only one type of circuitry. For example, a first pass inserts only scrambling/descrambling logic, a second pass modifies flip-flops, a third pass inserts masking logic, etc.

After the type of obfuscation circuitry has been chosen at 908 (if a choice is required), an operation 910 inserts the circuitry at the current location. Various rules may be employed to insert the selected logic. For example, some rules may specify how many additional flip-flops are to be inserted at a given location on the basis of the circuit environment at the location. Other rules may specify how many levels on an entangler tree must be inserted based on how many input signals are identified for entanglement. Of course, in selecting a location for insertion or entangler circuitry, the system may require that the location have at least X number of signal paths running in parallel. Still other rules can specify the shift register depth for scrambler circuitry as shown in FIG. 6. If existing circuitry is to be replaced, then the rules will specify how much is to be replaced and with what. In addition, some rules will specify that when circuitry for mixing signals is inserted at one location, complementary circuitry for inverting the mixing must be inserted at another location. As indicated, when scrambling or entangling circuitry is inserted at one location, descrambling or detangling circuitry must be inserted at a different, downstream, location.

Next, a decision block 914 determines whether any other locations within the electronic design are available for obfuscation. If it is determined that other such locations are available for obfuscation, then process control returns to block 906 and operations 906, 908, 910, and 914 are performed as described above. These cycles of obfuscation continue until all pertinent locations within the IP core are considered. When no other locations remain for consideration, the obfuscation system has completed its task of inserting obfuscation circuitry in the IP core. At that point, the obfuscated IP core may be used provided as a simulation model—assuming that no format conversion is required (e.g., to Verilog). As shown, the system outputs the obfuscated circuitry at 916.

Optionally, the obfuscation system performs an optimization operation (shown in FIG. 2) to partially merge the obfuscation circuitry and the functional circuitry in the design. An advantage of optimizing is to protect the obfuscation from removal by unauthorized procedures.

It is important to note that any of the steps in the methods embodied in the present invention can fully or partially automated. For example, the operations of identifying (e.g., 904, 906), choosing (e.g., 908), and inserting (e.g., 910) can be done automatically by software or other instructions executing on a processor. Furthermore, some steps may be omitted or arranged differently in sequence as will be apparent to one skilled in the art.

Note also that the above methodology may be implemented as an obfuscation system or module (e.g., module 210 of FIG. 2) having one or more logical blocks (e.g., portions of program code and/or ASIC logic). For example, a scanning module may be designed to identify a region within the electronic design suitable for introducing obfuscation. Thus, the scanning module may identify regions that are likely to avoid removal by a synthesizer or other EDA tool. Furthermore, the scanning module may identify general regions that are off-limits for obfuscation (e.g., portions of the electronic design made available to the user to facilitate maintenance, troubleshooting, or evaluation). Still further, the scanning module may identify regions that include an electrical path that directly impacts the performance of the electronic design. This electrical path can also be a critical path. By selecting a critical path for the insertion of obfuscation circuitry, the scanning module may ensure that obfuscation will negatively impact performance of any hardware implementation derived from the simulation model.

The obfuscation system may also include a selection module that chooses suitable types of obfuscation circuitry for insertion at regions identified by the scanning module. The principles of such selection are described elsewhere herein. The obfuscation system may further include an insertion module configured for inserting the type of obfuscation circuitry chosen by the selection module into the location identified by the scanning module. This may involve determining the exact input and output points for insertion in the electronic design and determining how large the obfuscation circuitry should be to handle all input signals in the selected region. The insertion module may be configured to ensure the chosen type of obfuscation circuitry is inserted in a manner that recovers certain original signals at the identified location downstream from that location. In one embodiment, the insertion module replaces a first set of logic within the identified region with a second set of logic. The second set of logic is configured for enabling identical functionality as the first set of logic, but done so with relatively more logic as compared to the first set of logic.

Upon inserting the chosen type of obfuscation into the identified region by the insertion module, an obfuscated region is produced. Accordingly, the region that was not identified by the scanning module for introducing obfuscation is called a non-obfuscated region. Together, the obfuscated region and the non-obfuscated region (sometimes referred to as a functional region) collectively form the obfuscated version of the electronic design. The obfuscated version is now generally available for producing a simulation model that provides adequate simulation (sometimes bit and/or cycle accurate simulation) and prevents practical implementation of the electronic design on a target hardware device.

Applications

While the methods, apparatus, and computer program products of this invention are applicable to any electronic design, and especially to IP cores, they find particular value in the context of programmable logic devices (PLDs). Specifically, the obfuscated IP cores used as simulation models of this invention can be employed to assist in the development of PLD designs employing non-obfuscated versions of the IP cores.

Generally, a PLD is a programmable integrated circuit that allows the user of the circuit, using software control, to customize the logic functions the circuit will perform. Examples of PLDs are FPGAs (Field Programmable Gate Arrays) and EPLDs (Erasable Programmable Logic Devices). The logic functions previously performed by small, medium and large-scale integration integrated circuits can instead be performed by programmable logic devices. As indicated, programmable logic devices supplied by integrated circuit manufacturers like Altera Corporation (a more detailed description of these products can be found at "www.altera.com") are not inherently capable of performing any specific function. The user, in conjunction with software supplied by the PLD manufacturer, can program the PLD to perform the specific function or functions required by the user's application. The PLD then can function in a larger system designed by the user, just as though dedicated logic chips were employed.

A typical PLD includes an array of logic cells that can be individually programmed and arbitrarily interconnected to each other to provide internal input and output signals, thus permitting the performance of complex combinational and sequential logic functions. The program is implemented in the PLD by setting the states of programmable elements such as memory cells. These memory cells may be implemented with volatile memories, such as SRAMs, which lose their programmed states upon termination of power to the system. If the programmable elements used are volatile memories, the memory cells must be configured upon each system power-up in order to configure the PLD.

In addition to methods, apparatus, and computer program products, this invention also relates to programmable logic devices (and other target hardware devices, including non-programmable devices including ASICs and even general purpose integrated circuits) programmed with a design prepared in accordance with the above-described methods.

Although many advantages have been presented in the description herein, other advantages will be apparent to those skilled in the art. For example, obfuscation circuitry other than flip-flops, non-transforming masks, scramblers, and entanglers may be used. Examples include the use of adders and subtractors. To illustrate, assume n=8 inputs (e.g., I7 ... I0). Next, divide these inputs into 2 binary vectors and treat them as 2's complement binary numbers: A=A3 ... A0; B=B3 ... B0. To entangle, the sums are calculated (e.g., S=S4 ... S0=A+B) and the differences are calculated (e.g., D=D4 ... D0=A−B) where "+" and "−" are 2's complement binary addition and subtraction. An extra bit may be required in S and D to hold the result of any necessary borrow and carry operations. To detangle, calculations of a=a3 ... a0=(S+D)/2=(A+B+A−B)/2=A ... A0 and b=b3 ... b0=(S−D)/2= (A+B−(A−B))/2=B=B3 ... B0) are performed. Accordingly, O7 ... O0=a3 ... a0, b3 ... b0=A, B=A3 ... A0, B3 ... B0=I7 ... I0. It is important to note that the inputs can be divided into more than 2 binary vectors and that these can be entangled using multiple linear combinations of these vectors. Furthermore, other entangling schemes or encryption algorithms (e.g., data encryption method—DES) may also be used.

The foregoing describes the instant invention and its presently preferred embodiments. Numerous modifications and variations in the practice of this invention are expected to occur to those skilled in the art. For instance, the techniques and systems of the present invention are suitable for use with a wide variety of EDA tools and methodologies for designing, simulating, compiling and/or programming a device. Therefore, the described embodiments should be taken as illustrative and not restrictive, and the invention should not be limited to the details given herein but should be defined by the following claims and their full scope of equivalents.

What is claimed is:

1. A method of producing a simulation model of an electronic design, the method comprising:
   receiving a non-obfuscated version of the electronic design suitable for direct compilation into a practical hardware implementation of the electronic design;
   identifying a region of said electronic design into which a type of obfuscation may be added;
   adding obfuscation circuitry to said electronic design to produce an obfuscated version of the electronic design, wherein said obfuscation circuitry prevents practical implementation of the electronic design on a target hardware device;
   creating a simulation model using said obfuscated version of said electronic design, said simulation model being suitable for producing accurate hardware simulation results in a simulator but not being suitable to be directly compiled to produce a practical hardware implementation of the electronic design;
   storing said simulation model in a computer system; and
   wherein adding the obfuscation circuitry comprises:
   at a first location, adding circuitry for entangling multiple input signals to thereby spread out the input signals; and
   at a second location, adding circuitry for detangling an output signal resulting from the circuitry for entangling.

2. A method as recited in claim 1, wherein the non-obfuscated version of the electronic design is provided in an HDL source format and said creating a simulation model includes using said obfuscated version of said electronic design as said simulation model.

3. A method as recited in claim 1, wherein the electronic design is a reusable functional logic block.

4. A method as recited in claim 1, wherein adding obfuscation circuitry includes:
   identifying a region for introduction of obfuscation circuitry in the non-obfuscated version of the electronic design;
   choosing a type of obfuscation circuitry for insertion; and
   inserting the chosen type of obfuscation circuitry into the identified region, thereby creating an obfuscated region.

5. A method as recited in claim 4, wherein identifying a region for introduction of obfuscation circuitry includes identifying in the non-obfuscated version of the electronic design logic of a type that is not removed by a synthesizer.

6. A method as recited in claim 5, wherein the type of logic that is not removed by a synthesizer includes one or more flip-flops.

7. A method as recited in claim 1, further comprising:
   optimizing the obfuscated version of the electronic design by merging the obfuscation circuitry with non-obfuscated functional circuitry of said obfuscated version.

8. A method as recited in claim 1, wherein the obfuscation circuitry increases the size of the electronic design without changing its function or slows the speed of the electronic design without changing its function.

9. A method as recited in claim 1, wherein adding obfuscation circuitry comprises:
   at a first location, adding circuitry for scrambling an input signal by spreading out the input signal in time; and
   at a second location, adding circuitry for de-scrambling an output signal resulting from the circuitry for scrambling.

10. A method as recited in claim 1, wherein the obfuscation circuitry includes an XOR tree.

11. A method as recited in claim 1, wherein adding obfuscation circuitry is performed automatically without user intervention.

12. An apparatus for producing a simulation model of an electronic design, the apparatus comprising:
   one or more processors;
   memory;
   a design entry tool that allows a developer to input a non-obfuscated version of said electronic design;
   an obfuscation module for identifying a region of said electronic design and adding obfuscation circuitry to said non-obfuscated version of the electronic design to produce an obfuscated version of the electronic design from which the simulation model can be created, wherein said obfuscation circuitry prevents practical implementation of the electronic design on a target hardware device, said obfuscation module creating said simulation model, said simulation model being suitable for producing accurate hardware simulation results in a simulator but not being suitable to be directly compiled to produce a practical hardware implementation of the electronic design; and wherein the obfuscation circuitry comprises:
at a first location, an entangler having circuitry for entangling multiple input signals to thereby spread out the input signals; and
at a second location, a detangler having circuitry for detangling an output signal resulting from the circuitry for entangling.

13. An apparatus as recited in claim 12, wherein the non-obfuscated version of the electronic design is in an HDL source format, said simulation model being said obfuscated version of said electronic design.

14. An apparatus as recited in claim 12, wherein the electronic design is a reusable functional logic block.

15. An apparatus as recited in claim 12, wherein the obfuscation module comprises:
a scanning module for identifying a region for introduction of obfuscation circuitry in the non-obfuscated version of the electronic design;
a selection module for choosing a type of obfuscation circuitry for insertion; and
an insertion module for inserting the chosen type of obfuscation circuitry into the identified region, thereby creating an obfuscated region.

16. An apparatus as recited in claim 15, wherein the scanning module for identifying a region for introduction of obfuscation circuitry includes identifying in the non-obfuscated version of the electronic design logic of a type that is not removed by a synthesizer.

17. An apparatus as recited in claim 16, wherein the type of logic that is not removed by a synthesizer includes one or more flip-flops.

18. An apparatus as recited in claim 13, further comprising:
an optimizer for optimizing the obfuscated version of the electronic design by merging the obfuscation circuitry with non-obfuscated functional circuitry of said obfuscated version.

19. An apparatus as recited in claim 12, wherein the obfuscation circuitry increases the size of the electronic design without changing its function or slows the speed of the electronic design without changing its function.

20. An apparatus as recited in claim 12, wherein the obfuscation circuitry comprises:
at a first location, a scrambler having circuitry for scrambling an input signal by spreading out the input signal in time; and
at a second location, a descrambler having circuitry for de-scrambling an output signal resulting from the circuitry for scrambling.

21. An apparatus as recited in claim 12, wherein the obfuscation circuitry includes an XOR tree.

22. An apparatus as recited in claim 15, wherein the scanning module, the selection module, and the insertion module are configured to operate automatically without user intervention.

23. A computer program product comprising a tangible computer readable storage medium on which is provided program instructions for producing a simulation model of an electronic design, the program instructions comprising:
instructions for receiving a non-obfuscated version of the electronic design suitable for direct compilation into a practical hardware implementation of the electronic design;
instructions for identifying a region of said electronic design into which a type of obfuscation may be added;
instructions for adding obfuscation circuitry to said electronic design to produce an obfuscated version of the electronic design, wherein said obfuscation circuitry prevents practical implementation of the electronic design on a target hardware device;
instructions for creating a simulation model using said obfuscated version of said electronic design, said simulation model being suitable for producing accurate hardware simulation results in a simulator but not being suitable to be directly compiled to produce a practical hardware implementation of the electronic design; and
wherein the instructions for adding obfuscation circuitry comprise:
instructions for adding circuitry at a first location to entangle multiple input signals to thereby spread out the input signals; and
instructions for adding circuitry at a second location to detangle an output signal resulting from the circuitry to entangle.

24. A computer program product as recited in claim 23, wherein the non-obfuscated version of the electronic design is provided in an HDL source format and said creating a simulation model includes
using said obfuscated version of said electronic design as said simulation model.

25. A computer program product as recited in claim 23, wherein the electronic design is a reusable functional logic block.

26. A computer program product as recited in claim 23, wherein the instructions for adding obfuscation circuitry comprises:
instructions for identifying a region for introduction of obfuscation circuitry in the non-obfuscated version of the electronic design;
instructions for choosing a type of obfuscation circuitry for insertion; and
instructions for inserting the chosen type of obfuscation circuitry into the identified region, thereby creating an obfuscated region.

27. A computer program product as recited in claim 26, wherein the instructions for identifying a region for introduction of obfuscation circuitry comprises identifying in the non-obfuscated version of the electronic design logic of a type that is not removed by a synthesizer.

28. A computer program product as recited in claim 27, wherein the type of logic that is not removed by a synthesizer includes one or more flip-flops.

29. A computer program product as recited in claim 26, further comprising:
instructions for optimizing the obfuscated version of the electronic design by merging the obfuscation circuitry with non-obfuscated functional circuitry of said obfuscated version.

30. A computer program product as recited in claim 23, wherein the obfuscation circuitry increases the size of the electronic design without changing its function and/or slows the speed of the electronic design without changing its function.

31. A computer program product as recited in claim 23, wherein the instructions for adding obfuscation circuitry comprise:
instructions for adding circuitry at a first location to scramble an input signal by spreading out the input signal in time; and
instructions for adding circuitry at a second location to de-scrambling an output signal resulting from the circuitry to scramble.

32. A computer program product as recited in claim 23, wherein the obfuscation circuitry includes an a XOR tree.

33. A computer program product as recited in claim 26, wherein the operations of identifying, choosing, and inserting can be done automatically without user intervention.

34. A method of producing a simulation model of an intellectual property core, wherein the simulation model produces a hardware simulation result but cannot be directly compiled to produce a practical hardware implementation of the IP core, the method comprising:
(a) receiving a non-obfuscated version of the IP core in a native HDL format or in a partially compiled HDL format;
(b) identifying a region of the non-obfuscated IP core where one or more flip-flops are located;
(c) inserting entangler circuitry upstream from the region and inserting complementary detangler circuitry downstream from the region;
(d) inserting scrambler circuitry upstream from the region and inserting complementary descrambler circuitry downstream from the region;
(e) optimizing the IP core after the insertions of (c) and (d); and
(f) producing a simulation model using said optimized IP core that includes said inserted entangler and inserted scrambler circuitry.

35. A method as recited in claim 8, wherein the obfuscation circuitry increases the area of the electronic design or reduces the speed of a critical path of the electronic design.

36. An apparatus as recited in claim 19, wherein the obfuscation circuitry increases the area of the electronic design or reduces the speed of a critical path of the electronic design.

37. A computer program product as recited in claim 30, wherein the obfuscation circuitry increases the area of the electronic design or reduces the speed of a critical path of the electronic design.

38. A method as recited in claim 34, wherein said entangler and scrambler circuitry increases the area of said functional logic block and reduces the speed of a critical path of said functional logic block.

39. A method as recited in claim 1 wherein said simulation model is cycle accurate and bit accurate.

40. An apparatus as recited in claim 12 wherein said simulation model is cycle accurate and bit accurate.

41. A computer program product as recited in claim 23 wherein said simulation model is cycle accurate and bit accurate.

42. A method as recited in claim 34 further comprising:
producing a simulation model using said optimized intellectual property core, wherein said simulation model is cycle accurate and bit accurate.

43. A method as recited in claim 34 further comprising:
producing a simulation model using said optimized intellectual property core, wherein said simulation model is cycle accurate and bit accurate.

44. A method as recited in claim 3 wherein said functional logic block is an intellectual property core.

45. An apparatus as recited in claim 14 wherein said functional logic block is an intellectual property core.

46. A computer program product as recited in claim 25 wherein said functional logic block is an intellectual property core.

47. A method as recited in claim 1, wherein the non-obfuscated version of the electronic design is provided in a partially compiled format, and wherein said creating a simulation model includes
using a translation utility to convert said obfuscated version of said electronic design into said simulation model having a standard format usable by a variety of simulators.

48. An apparatus as recited in claim 12, wherein the non-obfuscated version of the electronic design is provided in a partially compiled format, said apparatus further comprising:
a model writer module that converts said obfuscated version of said electronic design into said simulation model having a standard format usable by a variety of simulators.

49. A computer program product as recited in claim 23, wherein the non-obfuscated version of the electronic design is provided in a partially compiled format, and wherein said creating a simulation model includes
using a translation utility to convert said obfuscated version of said electronic design into said simulation model having a standard format usable by a variety of simulators.

* * * * *